(12) United States Patent
Feng et al.

(10) Patent No.: US 7,249,310 B1
(45) Date of Patent: Jul. 24, 2007

(54) ERROR EVALUATOR FOR INVERSIONLESS BERLEKAMP-MASSEY ALGORITHM IN REED-SOLOMON DECODERS

(75) Inventors: Weishi Feng, San Jose, CA (US); Zhan Yu, Sunnyvale, CA (US)

(73) Assignee: Marvell International Ltd., Hamilton (BM)

(*) Notice: Subject to any disclaimer, the term of this patent is extended or adjusted under 35 U.S.C. 154(b) by 47 days.

(21) Appl. No.: 11/243,283

(22) Filed: Oct. 4, 2005

Related U.S. Application Data

(63) Continuation of application No. 10/304,511, filed on Nov. 26, 2002, now Pat. No. 7,010,739.

(60) Provisional application No. 60/371,898, filed on Apr. 11, 2002.

(51) Int. Cl.
 *H03M 13/03* (2006.01)
(52) U.S. Cl. .................................................. 714/784
(58) Field of Classification Search ................ 714/781, 714/782, 784, 785
 See application file for complete search history.

(56) References Cited

U.S. PATENT DOCUMENTS

| | | | |
|---|---|---|---|
| 4,839,896 A | 6/1989 | Glover et al. ................ 714/759 |
| 6,092,233 A | 7/2000 | Yang ............................ 714/784 |
| 6,119,262 A * | 9/2000 | Chang et al. ................ 714/781 |
| 6,122,766 A | 9/2000 | Fukuoka et al. ............. 714/784 |
| 6,209,115 B1 * | 3/2001 | Truong et al. ............... 714/784 |
| 6,256,763 B1 | 7/2001 | Oh et al. ..................... 714/784 |
| 6,286,123 B1 | 9/2001 | Kim ............................ 714/781 |
| 6,317,858 B1 * | 11/2001 | Cameron ..................... 714/785 |
| 6,347,389 B1 | 2/2002 | Boyer ......................... 714/784 |
| 6,374,384 B1 | 4/2002 | Ohta et al. ................... 714/57 |
| 6,378,104 B1 | 4/2002 | Okita .......................... 714/784 |
| 7,051,267 B1 | 5/2006 | Yu et al. ...................... 714/784 |

FOREIGN PATENT DOCUMENTS

WO    WO99/09694    2/1999

OTHER PUBLICATIONS

Sarwate et al., High speed architecture for Reed Solomon decoders, Jun. 2000, www.google, printed in 2005, p. 1 to 33.*
Bose-Chaudhuri-Hocquenghme Codes, 7.5 Fast Decoding of BCH Codes, pp. 186-187.
Feng, "On Decoding Reed-Solomon Codes Up To And Beyond The Packing Radii", Chapter 2, University of Illinois at Urbana-Champaign, 1999, pp. 7-32.
Forney, Jr., "On Decoding BCH Codes", IEEE Transactions on Information Theory, vol. 11, No. 4, Oct. 1965, pp. 549-557.
Horiguchi, "High-Speed Decoding of BCH Codes Using a New Error-Evaluation Algorithm", Electronicsand Communications in Japan, Part 3, vol. 72, No. 12, 1989, pp. 63-71.

(Continued)

*Primary Examiner*—Shelly Chase

(57) ABSTRACT

An error correcting Reed-Solomon decoder includes an error locator polynomial generator that generates an error locator polynomial and a scratch polynomial based on an inversionless Berlekamp-Massey algorithm (iBMA). An error location finder communicates with the error locator polynomial generator and generates error locations. An error values finder communicates with the error locator polynomial generator and generates error values directly from the error locator polynomial and the scratch polynomial.

33 Claims, 6 Drawing Sheets

OTHER PUBLICATIONS

Massey, "Shift-Register Synthesis and BCH Decoding", IEEE Transactions on Information Theory, vol. 15, No. 1, Jan. 1969, pp. 122-127.

Chien, "Cycle Decoding Procedures for Bose-Chaudhuri-Hocquenghem Codes", IEEE Transactions on Information Theory, Oct. 1964, pp. 357-363.

Elwyn R. Berlekamp, "Algebraic Coding Theory, Binary BHC Codes for Correcting Multiple Errors", 1968, pp. 176-196.

Ralf Koetter, "On the determination of error values for codes from a class of maximal curves", University of Illinois Coordinated Science Laboratory, Urbana, Illinois, pp. 44-53.

Truong/Jeng/Hung, "Inversionless Decoding of Both Errors and Erasures of Reed-Solomon Code", IEEE Transactions on Communications, vol. 46, No. 8, Aug. 1998, pp. 973-976.

* cited by examiner

ERROR EVALUATOR FOR INVERSIONLESS BERLEKAMP-MASSEY ALGORITHM IN REED-SOLOMON DECODERS

CROSS-REFERENCE TO RELATED APPLICATIONS

This application is a continuation of U.S. application Ser. No. 10/304,511, filed Nov. 26, 2002, now U.S. Pat. No. 7,010,739, which claims the benefit of U.S. Provisional Application No. 60/371,898, filed Apr. 11, 2002, which are hereby incorporated by reference in their entirety.

FIELD OF THE INVENTION

The present invention relates to forward error correction (FEC), and more particularly to FEC using a Reed-Solomon decoder.

BACKGROUND OF THE INVENTION

Many communications systems perform forward error correction (FEC) to improve data transmission accuracy and to ensure data integrity. FEC helps reduce bit error rates (BER) in applications such as data storage, digital video broadcasts, and wireless communications. Reed-Solomon (RS) error-correcting codes are commonly used for FEC.

Referring now to FIG. 1, a first device 10-1 communicates with a second device 10-2 over a communications channel 12. The communications channel can be hardwired or wireless. For example, the communications channel 12 can be an Ethernet network, a wireless local area network, a bus for a hard drive, etc. The first device 10-1 includes components 14-1 that output signals to a RS encoder 16-1 and that receive signals from a RS decoder 18-1. Likewise, the device 10-2 includes components 14-2 that output signals to a RS encoder 16-2 and that receive signals from a RS decoder 18-2. The components 14-1 of the first device 10-1 may be similar to or different than the components 14-2 of the second device 10-2. The encoders 16 encode the data before the data is output onto the communications channel 12. The encoders 16 insert redundant bits into the data stream. The decoders 18 use the redundant bits to detect and, when possible, to correct errors in the received data.

Referring now to FIG. 2, steps that are performed by a RS decoder are shown generally at 20. In step 22, the RS decoder computes syndrome values. In step 24, the RS decoder computes an error locator polynomial. The error locator polynomial can be calculated using a Berlekamp-Massey algorithm (BMA), inversionless BMA (iBMA), Euclidean algorithm, or other suitable algorithms. In step 26, the Reed-Solomon decoder calculates an error evaluator polynomial, which is typically based on the syndrome values and the error locator polynomial.

In step 28, the RS decoder finds error locations. For example, Chien's search algorithm, which will be described below, can be used. In step 30, error values are found. For example, Forney's algorithm, which will be described below, is often used to find the error values. Steps 24 and 28 may be performed in parallel in hardware implementations.

Referring now to FIG. 3, a RS decoder 32 typically includes a syndrome calculator 34 and an error locator polynomial generator 36. The Reed-Solomon decoder 32 also includes an error evaluator polynomial generator 38, an error location finder 40 and a error value finder 42. Control devices 44 and storage devices 46 may also be used to control decoding and to store data values for use by the RS decoder 32. The RS decoder 32 can be implemented using register-based VLSI, software and a processor, an application specific integrated circuit (ASIC), or in any other suitable manner.

In "High-speed Decoding of BCH Codes Using a New Error-Evaluation Algorithm," T. Horiguchi, Electronics and Comm. in Japan, vol. 72, no. 12 (1989), an error evaluator for RS codes is computed during the BMA iterations. In "On the Determination of Error Values For Codes From a Class of Maximal Curves," R. Koetter, Proc. 35th Annual Allerton Conference on Communications, Control and Computing, Univ. of Illinois at Urbana-Champaign (1997), an error evaluator for algebraic geometry codes is disclosed. The error evaluator in Koetter reduces to the error evaluator in Horiguchi for RS codes.

The error evaluators in Horiguchi and Koetter require the BMA to be formulated in a manner that cannot be implemented in hardware easily. Berlekamp's formulation of the BMA has a more regular structure and can be readily implemented in hardware. A variation of the error evaluator for Berlekamp's formulation of the BMA is also disclosed in "On Decoding Reed-Solomon Codes up to and beyond the Packing Radii," W. Feng, Ph. D. dissertation, Univ. of Illinois at Urbana-Champaign (1999).

A typical BMA employs a Galois field inverter, which computes a multiplicative inverse of Galois field elements. An inversionless (or division-free) BMA (iBMA) eliminates the Galois field inverter. One advantage of iBMA is the reduced delay of a critical path of a VLSI implementation.

RS codes operate on finite fields ($GF(2^m)$). $GF(q)$ is a Galois field with q elements. $c=(c_o, c_l, \ldots, c_{n-1})$ is a vector of length n over $GF(q)$ where $n=q-1$. The Fourier transform of the vector c is $C=(C_0, C_1, \ldots, C_{n-1})$, where $$C_j = \sum_{i=0}^{n-1} c_i \alpha^{ij}, j = 0, 1, \ldots, n-1$$

and $\alpha$ is a primitive element of $GF(q)$. A t-error-correcting RS code is the collection of all vectors c with a Fourier transform satisfying $C_{m_0}=C_{m_0+1}=\ldots=C_{m_0+2t-1}=0$ for some integer $m_0$. The code has minimum Hamming distance $d_{min}=2t+1$. Note that a RS code can be shortened to a length $n<q-1$ if needed.

A vector $c=(c_0, c_1, \ldots, c_{n-1})$ can also be represented as a polynomial $c(x)=$ $$c(x) \sum_{i=0}^{n-1} c_i x^i.$$

The Fourier transform is a polynomial evaluation at $x=\alpha^0, \alpha^1, \ldots, \alpha^{n-1}$. In other words, $C_j=c(\alpha^j)$. A t-error-correcting RS code is the collection of all vectors c such that $c(\alpha^{m_0})=c(\alpha^{m_0+1})=\ldots=c(\alpha^{m_0+2t-1})=0$. Therefore, every codeword is a multiple of $$g(x)=(x-\alpha^{m_0})(x-\alpha^{m_0+1})\ldots(x-\alpha^{m_0+2t-1}).$$

The polynomial $g(x)$ is a generator polynomial of the Reed-Solomon code.

$v=c+e$ is the received vector where $e=(e_0, e_1, \ldots, e_{n-1})$ is the error vector and $e_i \neq 0$ when there is an error at the ith position. The codeword c and the error vector e are not known. The received vector v and the Fourier transform of c satisfy $C_{m_0} = \ldots = C_{m_0+2t-1} = 0$. V and E are the Fourier transforms of v and e, respectively. Because the Fourier transform is a linear transformation, $$V_i = C_i + E_i \text{ for } i = 0, 1, \ldots, n-1.$$

Because $C_i = 0$ for $i = m_0, m_0+1, \ldots, m_0+2t-1$, it follows that:

$$E_i = V_i \text{ for } i = m_0, m_{0+1}, \ldots, m_0+2t-1.$$

Therefore, the decoder can compute $E_i$ from the received vector for $i = m_0, \ldots, m_0+2t-1$. $E_i$ are denoted as $S_i = E_{i+m_0}$ for $i = 0, \ldots, 2t-1$ and are called syndromes.

The RS decoder computes e from the 2t syndromes. The task can be divided into two parts. First, the error locations are found. In other words, the decoder finds all i such that $e_i \neq 0$. Second, the error values $e_i$ are found for all of the error locations. Then, c can be recovered by subtracting e from v.

The RS decoder finds the error locator polynomial, which is defined as a polynomial $\Lambda(x)$ satisfying:

$$\Lambda(0) = 1; \text{ and } \Lambda(\alpha^{-i}) = 0 \text{ if and only if } e_i \neq 0.$$

The error locations are obtained by finding the zeros of $\Lambda(x)$. To determine the error values, a decoder usually computes the error evaluator polynomial, which is given by $\Gamma(x) = \Lambda(x)S(x) \mod x^{2t}$ where $S(x) =$ $$S(x) = \sum_{i=0}^{2t-1} S_i x^i$$

$S_i x^i$ is the syndrome polynomial.

If there are at most t errors, the error values can be determined (as set forth in G. D. Forney, Jr., "On Decoding BCH Codes," IEEE Trans. Inform. Theory, vol. 11, pp. 547–557 (1965), which is hereby incorporated by reference):

$$e_i = \begin{cases} 0 & \text{if } \Lambda(\alpha^{-i}) \neq 0 \\ \left. \frac{x^{m_0} \Gamma(x)}{x \Lambda'(x)} \right|_{x = \alpha^{-i}} & \text{if } \Lambda(\alpha^{-i}) = 0 \end{cases}$$

where $\Lambda'(x)$ is the formal derivative of $\Lambda(x)$. This formula is known as the Forney algorithm.

In a first decoding step, assuming the received vector is fed into the decoder symbol by symbol, Homer's rule can be used to reduce complexity. In other words, $E_j$ is evaluated as $$E_j = (\ldots((v_{n-1}\alpha^j + v_{n-2})\alpha^j) + \ldots + v_1)\alpha^j + v_0.$$

Note that $\alpha^n = 1$ and that only $S_j = E_{m_0+j}$ for $j = 0, 1, \ldots, 2t-1$ are needed. In a second decoding step, the error locator polynomial is calculated from the syndromes using any suitable algorithm such as Peterson-Gorenstein-Zierler algorithm, the BMA, and the Euclidean algorithm.

In a third decoding step, two approaches are generally used for computing the error evaluator polynomial if the BMA is used. A first approach computes the error evaluator polynomial simultaneously with the error locator polynomial using an iteration algorithm similar to the BMA. For example, see E. R. Berlekamp, *Algebraic Coding Theory*, New York, McGraw-Hill (1968). The cost of implementing this approach is high. A second approach computes the error evaluator polynomial after computing the error locator polynomial. The second approach is less complex than the first approach. However, decoding latency of the second approach is higher than the first approach.

In a fourth decoding step, $\Lambda(x)$ and $\Gamma(x)$ are known. The error values are determined using Forney's algorithm. Chien's search, which is used to find the zeros of the error locator polynomial $\Lambda(x)$, is typically performed in parallel with the error evaluation in hardware implementations.

When using the BMA, a linear-feedback shift register $(\Lambda, L)$ with length L and coefficients $\Lambda_0 = 1, \Lambda_1, \ldots, \Lambda_L$ produces the sequence $S_0, S_1, S_3, \ldots$ if:

$$S_j = -\sum_{i=1}^{L} \Lambda_i S_{j-i} \text{ for } j = L, L+1, \ldots.$$

If $(\Lambda, L)$ produces $S_0, \ldots, S_{r-1}$ but does not produce $S_0, \ldots, S_{r-1}, S_r$, then $(\Lambda, L)$ has a discrepancy $\Delta_r$ at $S_r$, where $$\Delta_r = \sum_{i=0}^{L} \Lambda_i S_{r-i}.$$

$\Lambda(x) =$ $$\Lambda(x) = \sum_{i=0}^{L} \Lambda_i x^i$$

is the feedback polynomial. Note that the degree of $\Lambda(x)$ is less than or equal to L because $\Lambda_L$ might be zero.

The BMA finds the shortest linear feedback shift register that produces a given sequence. If the number of errors is less than or equal to t, the error locator polynomial is the polynomial of lowest degree that produces the syndrome sequence $S_0, S_1, \ldots, S_{2t-1}$. If the number of errors is more than t, the BMA still finds the polynomial of lowest degree that generates the syndrome sequence. However, this polynomial is usually not a locator polynomial and the decoding algorithm fails.

Referring now to FIG. 4, one BMA implementation that is disclosed in Horiguchi and in J. L. Massey, "Shift-Register Synthesis and BCH Decoding," IEEE Trans. Inform. Theory, vol. 15, no. 1 (1969), which is hereby incorporated by reference is shown. In step 50, variables are initialized ($\Lambda(x) \leftarrow 1$, $B(x) \leftarrow 1$, $p \leftarrow 1$, $a \leftarrow 0$, $r \leftarrow 0$, $L \leftarrow 0$, $\Delta_B \leftarrow 1$). In step 54, control determines whether $r = 2t$. If true, control ends in step 58. Otherwise, the discrepancy $$\Delta \leftarrow \sum_{i=0}^{L} \Lambda_i S_{r-i}$$

is computed in step 60.

If $\Delta = 0$ in step 62, then $p \leftarrow p+1$ in step 64 and control continues with step 68. Otherwise, if $\Delta \neq 0$ and $2L > r$ as determined in step 70, then $\Lambda(x) \leftarrow \Lambda(x) - \Delta \Delta_B^{-1} x^p B(x)$ in step 72 and control continues with step 64. If $\Delta \neq 0$ and $2L \leq r$ as determined in step 76, then $T(x) \leftarrow \Lambda(x)$, $\Lambda(x) \leftarrow \Lambda(x) -$ $\Delta\Delta_B^{-1} x^p B(x)$, $B(x) \leftarrow T(x)$, $a \leftarrow r \leftarrow 2L$, $\Delta_B \leftarrow \Delta$, $L \leftarrow r+1-L$, and $p \leftarrow 1$ in step 80. Control continues from steps 64, 76 and 80 with step 68 where $r \leftarrow r+1$. Control continues from step 68 to step 54 until control ends in step 58. The parameter a in this algorithm is not disclosed in Massey. Parameter a was introduced by Horiguchi and is used for error evaluation.

$u \leq t$ is the number of errors. $X_l = \alpha^{i_l}$ and $Y_l$ are the error positions and the error values, respectively (that is $\Lambda(\alpha^{-i_l}) = 0$, $i=1, \ldots, u$). At the end of this algorithm:

$$\hat{B}(x) = \Delta_B^{-1} x^a B(x).$$

The error values are given by Horiguchi as follows:

$$Y_l = \frac{X_l^{-2u-m_0+3}}{\hat{B}(X_l^{-1}) \Lambda'(X_l^{-1})}.$$

The structure of this formulation is not easily implemented in register-based VLSI in which the coefficients of $\Lambda(x)$ and $B(x)$ are stored in registers. When updating the polynomial $\Lambda(x)$ in steps 76 and 80, the relationship between the coefficients of $\Lambda(x)$ and $B(x)$ depends on the variable p. In other words, $\Lambda_i = \Lambda_i - \Delta\Delta_B^{-1} B_{i-p}$, where p could be 1, or 2, or 3, ... x. This means that the circuit connections are not fixed. While multiplexers can be used to avoid this problem, this approach is not sufficiently cost effective.

Referring now to FIG. 5, Berlekamp's formulation with a minor modification has a more regular structure and is desirable for register-based VLSI implementations. The algorithm is disclosed in R. E. Blahut, *Theory and Practice of Error Control Codes*, Reading, Mass., Addison-Wesley Publishing Company (1983), which is hereby incorporated by reference. The algorithm is similar to Berlekamp's formulation.

The syndrome sequence $S_0, S_1, \ldots, S_{2t-1}$, and t are used as inputs. In step 100, initialization of variables is performed ($\Lambda(x) \leftarrow 1$, $B(x) \leftarrow 1$, $r \leftarrow 0$, $L \leftarrow 0$). In step 104, if $r=2t$, control ends in step 108. Otherwise, the discrepancy $$\Delta \leftarrow \sum_{i=0}^{L} \Lambda_i S_{r-i}$$

is computed in step 110. If $\Delta \neq 0$ and $2L \leq r$ in step 112, then $\delta \leftarrow 1$, $L \leftarrow r+1-L$ in step 114. Otherwise, $\delta \leftarrow 0$ in step 116. In step 120, the polynomials are updated as follows:

$$\begin{pmatrix} \Lambda(x) \\ B(x) \end{pmatrix} \leftarrow \begin{pmatrix} 1 - \Delta x \\ \Delta^{-1}\delta(1-\delta)x \end{pmatrix} \begin{pmatrix} \Lambda(x) \\ B(x) \end{pmatrix}$$

In step 124, $r \leftarrow r+1$ and control continues with step 104.

At each clock cycle, the register bank for $B(x)$ either shifts right $B_i \leftarrow B_{i-1}$ corresponding to $B(x) \leftarrow xB(x)$, or parallel loads $B_i \leftarrow \Delta^{-1}\Lambda_i$ corresponding to $B(x) \leftarrow \Delta^{-1}\Lambda(x)$. The register bank for $\Lambda(x)$ is updated by $\Lambda_i \leftarrow \Lambda_i - \Delta B_{i-1}$. Note that this algorithm does not provide an error evaluator. In W. Feng, "On Decoding Reed-Solomon Codes Up to and Beyond the Packing Radii," Reading, Ph.D. dissertation, Univ. of IL at Urbana-Champaign (1999), which is hereby incorporated by reference, an error evaluator for this BMA formulation was derived as follows:

$$e_i = \begin{cases} 0 & \text{if } \Lambda(\alpha^{-i}) \neq 0, \\ \dfrac{\alpha^{-i(m_0+2t-2)}}{B^{(2t)}(\alpha^{-i})\Lambda'(\alpha^{-i})} & \text{if } \Lambda(\alpha^{-i}) = 0, \end{cases}$$

or equivalently:

$$Y_l = \frac{X_l^{-(m_0+2t-2)}}{B^{(2t)}(X_l^{-1})\Lambda'(X_l^{-1})},$$

where $B^{(2t)}(x)$ is the scratch polynomial at the end of 2t iterations of the algorithm shown in FIG. 5. This evaluator is functionally equivalent to the Horiguchi-Koetter evaluator.

Referring now to FIG. 6, the iBMA is a modification of the algorithm in FIG. 5. The syndrome sequence $S_0$, $S_1, \ldots, S_{2t-1}$ and t are inputs. In step 130, $\Lambda(x) \leftarrow 1$, $B(x) \leftarrow 1$, $r \leftarrow 0$, $L \leftarrow 0$, $\Delta_B \leftarrow 1$. In step 134, if $r=2t$, control ends in step 136. Otherwise in step 138, the discrepancy $$\Delta \leftarrow \sum_{i=0}^{L} \Lambda_i S_{r-i}$$

is computed. If $\Delta \neq 0$ as determined in step 142, $\Lambda(x) \leftarrow \Delta_B \Lambda(x) + \Delta x B(x)$ in step 144. Otherwise, $\Lambda(x) \leftarrow \Lambda(x)$ in step 146. If $\Delta \neq 0$ and $2L \leq r$ as determined in step 146, $B(x) \leftarrow \Lambda(x)$, $L \leftarrow r+1-L$ and $\Delta_B \leftarrow \Delta$ in step 148. Otherwise, $B(x) \leftarrow xB(x)$ in step 150. In step 154, $r \leftarrow r+1$. Control continues from step 154 to step 134.

Note that the $\Lambda(x)$ produced by the algorithm in FIG. 6 is a constant multiple of the $\leftarrow(x)$ produced by the algorithm of FIG. 5 and no longer satisfies the condition of $\leftarrow(0)=1$. $\Lambda(x)$ is still referred to as the error-locator polynomial because it still "locates" the errors. In other words, the roots of this polynomial point to the error locations if the number of errors in the received vector is less than or equal to the correction power t.

As can be appreciated from the forgoing, the steps performed by RS decoders can be complex and can involve a large number of calculations. Reducing the number of calculations and increasing the speed of RS decoding would be desirable.

SUMMARY OF THE INVENTION

An error correcting Reed-Solomon decoder according to the present invention includes a syndrome calculator that calculates syndrome values. An error locator polynomial generator communicates with the syndrome calculator and generates an error locator polynomial. An error location finder communicates with at least one of the syndrome calculator and the error locator polynomial generator and generates error locations. An error values finder communicates with at least one of the syndrome calculator, the error location finder and the error locator polynomial generator and generates error values without calculating an error evaluator polynomial.

In other features, the error locator polynomial generator is an inversionless Berlekamp-Massey algorithm (iBMA). The error location finder finds zeros in the error locator polynomial. The iBMA calculates an error locator polynomial and a scratch polynomial. The error values are calculated using an error value relationship that is based on the error locator polynomial and the scratch polynomial.

An error correcting Reed-Solomon decoder according to the present invention includes an error locator polynomial generator that generates an error locator polynomial and a scratch polynomial based on an inversionless Berlekamp-Massey algorithm (iBMA). An error location finder communicates with the error locator polynomial generator and generates error locations. An error values finder communicates with at least one of the error location finder and the error locator polynomial generator and generates error values using an error value relationship that is based on the error locator polynomial and the scratch polynomial.

An error correcting Reed-Solomon decoder comprises an error locator polynomial generator that generates an error locator polynomial and a scratch polynomial based on an inversionless Berlekamp-Massey algorithm (iBMA); an error location finder that communicates with the error locator polynomial generator and that generates error locations; and an error values finder that communicates with the error locator polynomial generator and that generates error values directly from the error locator polynomial and the scratch polynomial.

In other features, the error correcting Reed-Solomon decoder further comprises a syndrome calculator that calculates syndrome values. The error locator polynomial generator uses the syndrome values to generate the error locator and scratch polynomials. The error location finder determines roots of the error locator polynomial, the roots representing the error locations. Each of the error values corresponds to one of the error locations and the error values finder determines the error values by evaluating an expression for each of the error locations. The error locator polynomial generator generates a discrepancy value concurrently with the error locator polynomial, and the expression includes the discrepancy value. The expression includes a derivative of the error locator polynomial.

An error correcting Reed-Solomon decoder comprises error locator polynomial generating means for generating an error locator polynomial and a scratch polynomial based on an inversionless Berlekamp-Massey algorithm (iBMA); error location finding means that communicates with the error locator polynomial generating means for generating error locations; and error values finding means that communicates with the error locator polynomial generating means for generating error values directly from the error locator polynomial and the scratch polynomial.

In other features, the error correcting Reed-Solomon decoder further comprises syndrome calculating means for calculating syndrome values. The error locator polynomial generating means uses the syndrome values to generate the error locator and scratch polynomials. The error location finding means determines roots of the error locator polynomial, the roots representing the error locations. Each of the error values corresponds to one of the error locations and the error values finding means determines the error values by evaluating an expression for each of the error locations. The error locator polynomial generating means generates a discrepancy value concurrently with the error locator polynomial, and the expression includes the discrepancy value. The expression includes a derivative of the error locator polynomial.

A method for performing error correction comprises generating an error locator polynomial and a scratch polynomial based on an inversionless Berlekamp-Massey algorithm (iBMA); identifying error locations using the error locator polynomial; and identifying error values directly from the error locator polynomial and the scratch polynomial.

In other features, the method further comprises calculating syndrome values. The generating includes using the syndrome values to generate the error locator and scratch polynomials. The identifying error locations includes determining roots of the error locator polynomial, the roots representing the error locations. Each of the error values corresponds to one of the error locations and the identifying error values includes evaluating an expression for each of the error locations. The generating includes generating a discrepancy value concurrently with the error locator polynomial, and the expression includes the discrepancy value. The expression includes a derivative of the error locator polynomial.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
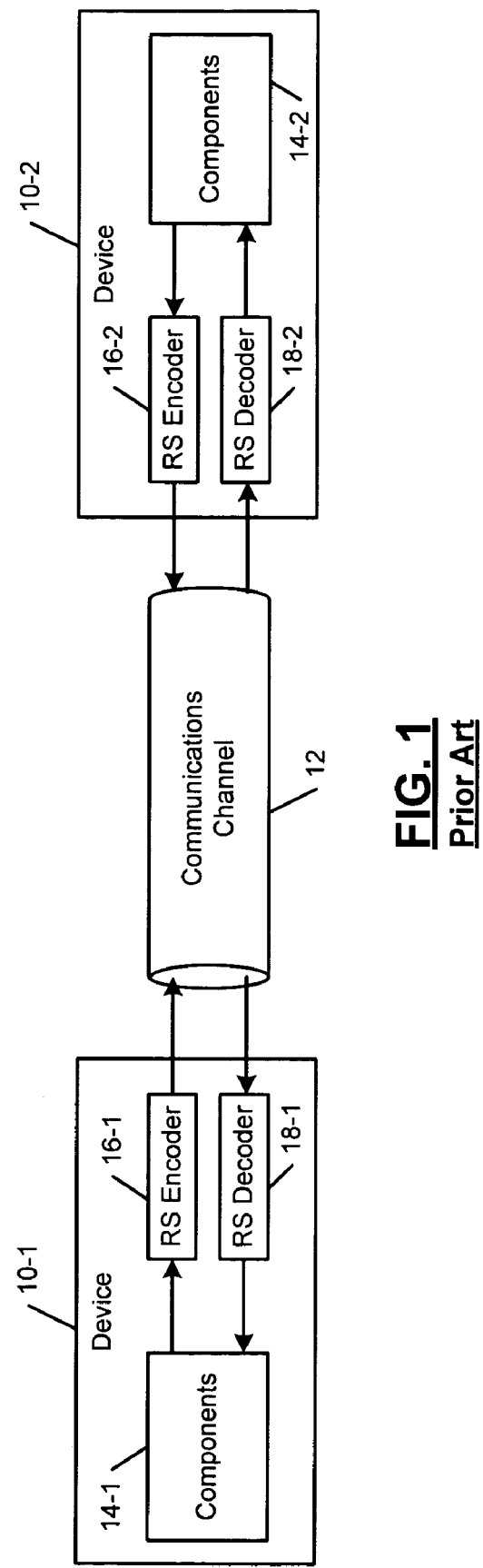
FIG. 1 is a functional block diagram of first and second devices that include RS encoders/decoders according to the prior art.
Figure 3:
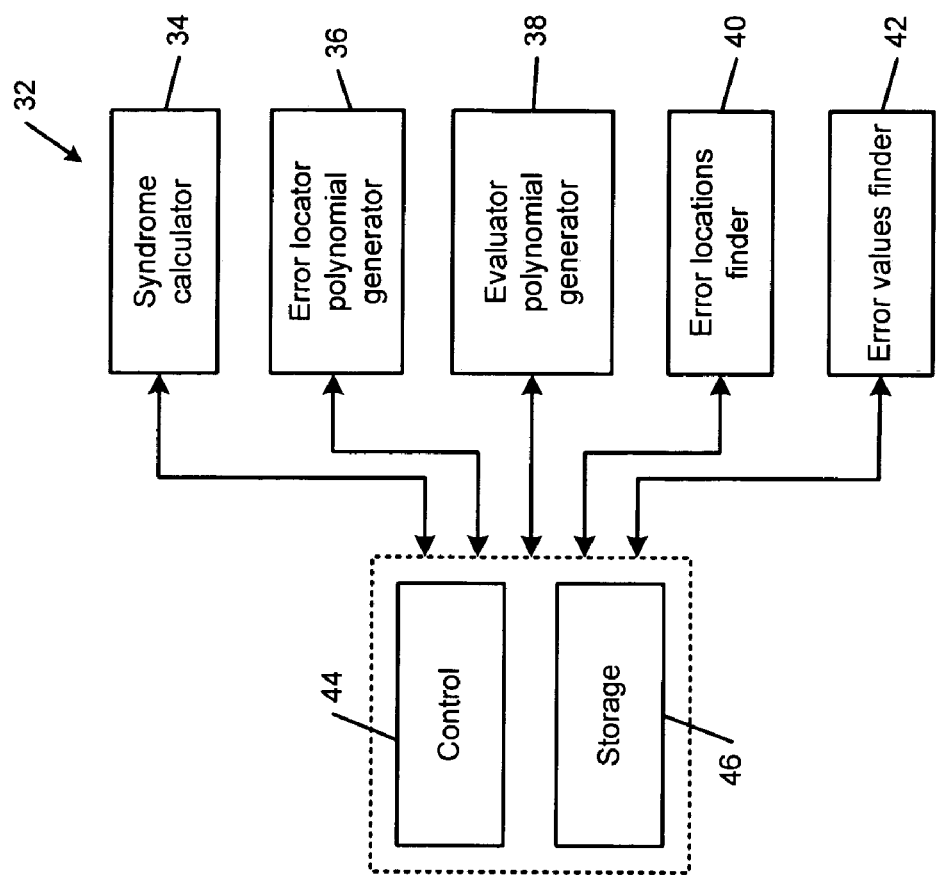
FIG. 3 is a functional block diagram of a RS decoder according to the prior art.
Figure 2:
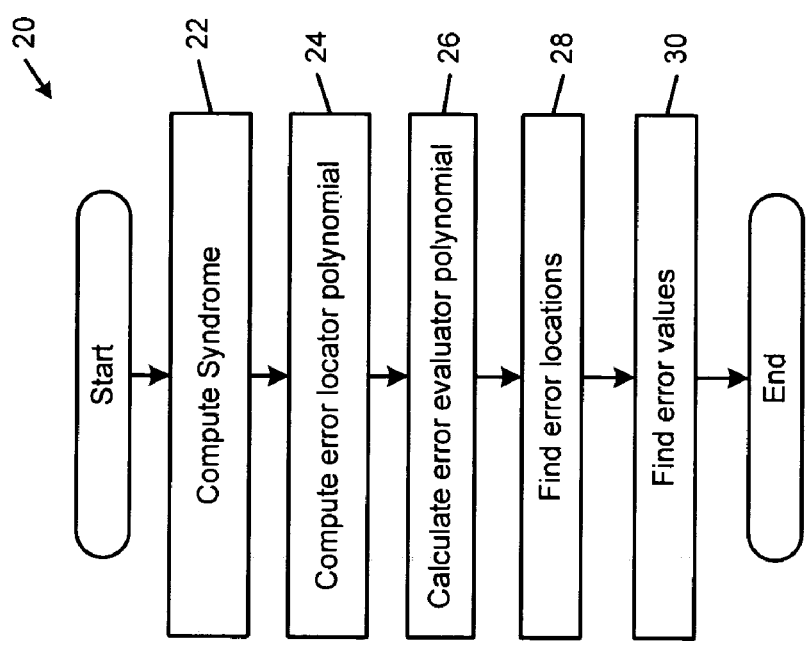
FIG. 2 illustrates steps for RS decoding according to the prior art.
Figure 4:
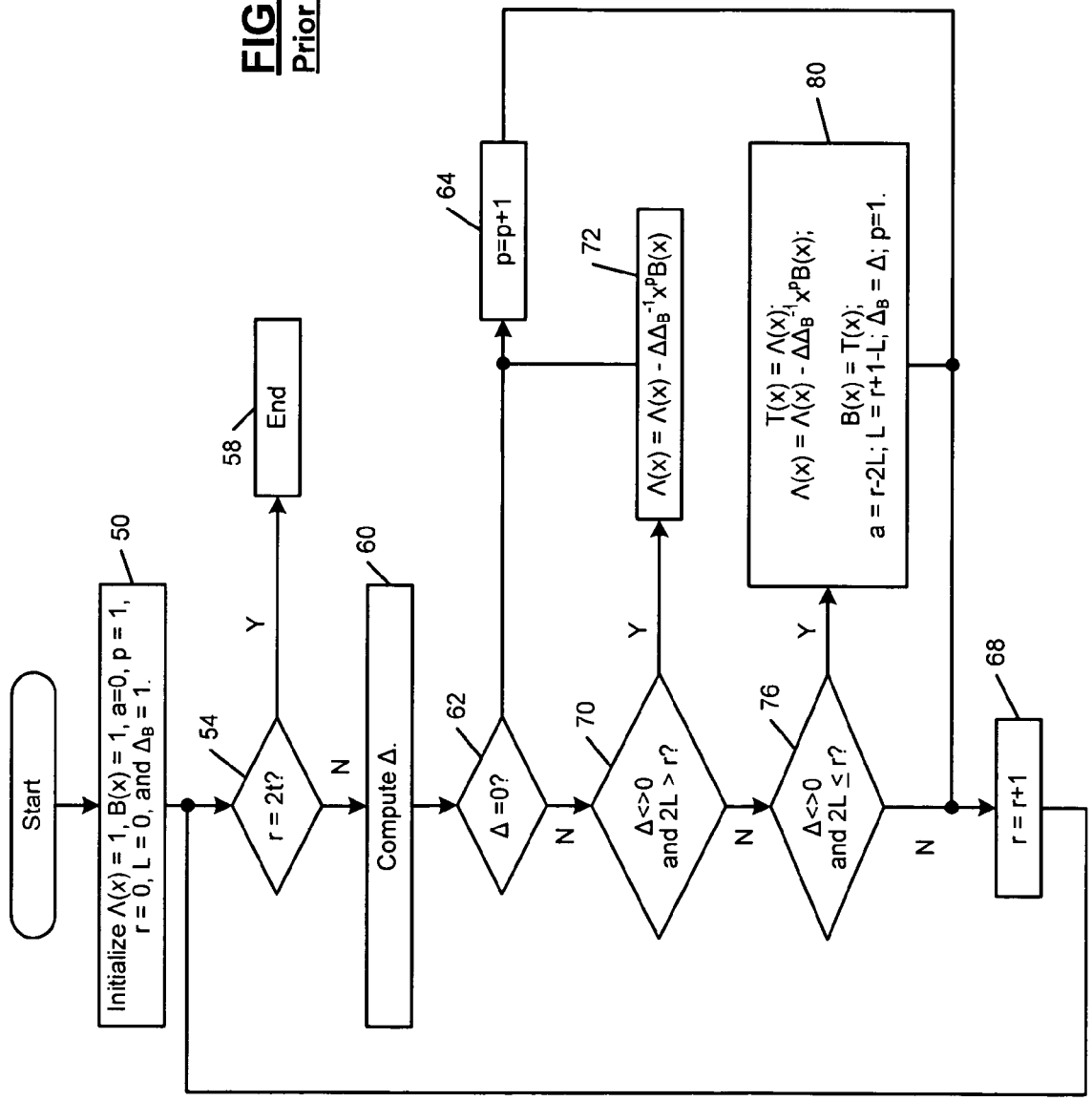
FIG. 4 illustrates steps of a BMA disclosed by Massey and Horiguchi for calculating an error locator polynomial according to the prior art.
Figure 5:
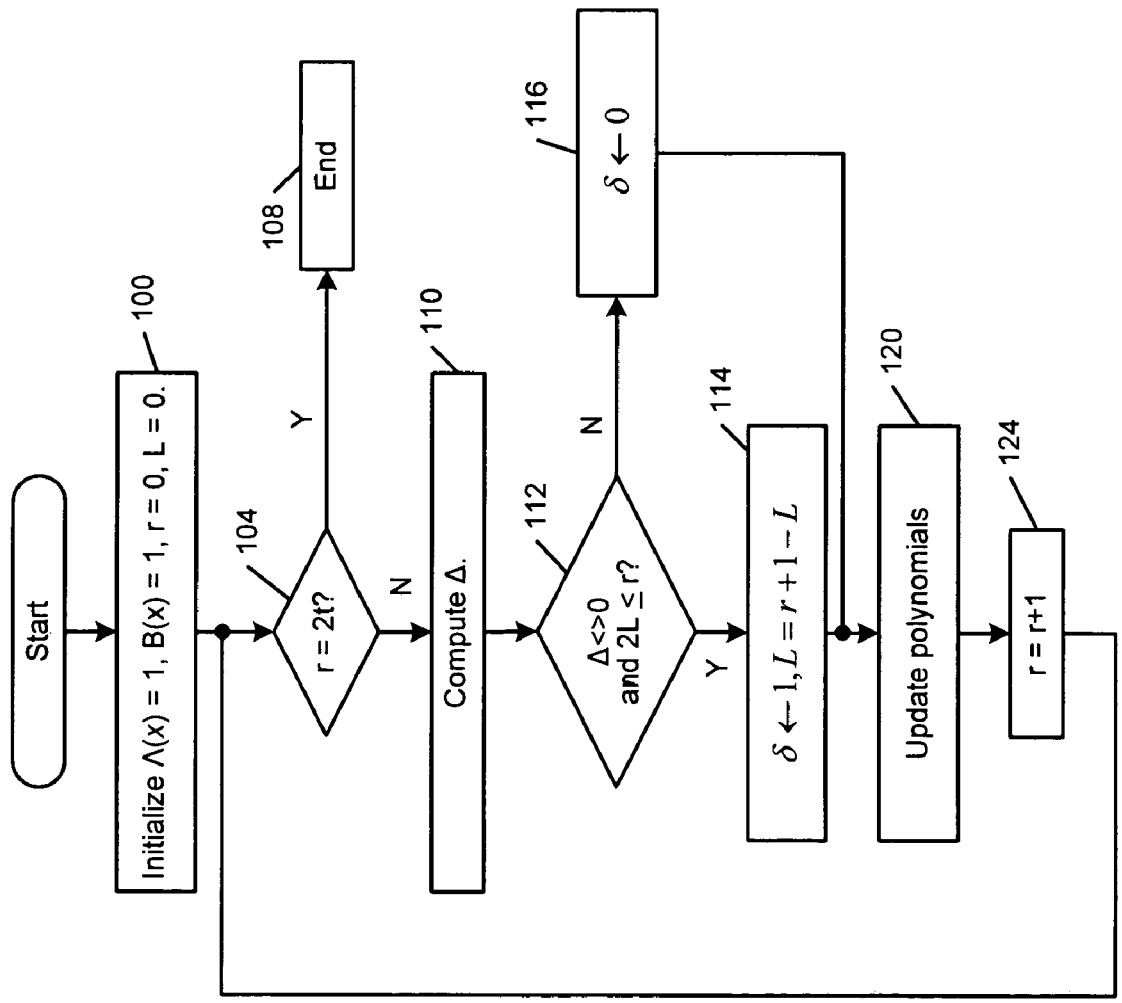
FIG. 5 illustrates steps of Berlekamp's formulation of the BMA for calculating an error locator polynomial according to the prior art.

The following description of the preferred embodiment(s) is merely exemplary in nature and is in no way intended to limit the invention, its application, or uses. For purposes of clarity, the same reference numbers will be used in the drawings to identify similar elements.

The calculation of the traditional error evaluator polynomial increases the amount of time and/or more hardware that is required to perform RS decoding. The present invention discloses a RS decoder that eliminates the need for the error evaluator polynomial. As a result, the error evaluator need not be calculated and the amount of time that is required to perform RS decoding is significantly reduced.

The RS decoder according to the present invention calculates error values based on the error-locator polynomial and the scratch polynomial that are generated by the inversionless Berlekamp-Massey (iBMA) algorithm. In addition to reduced decoding time, the hardware that is required to implement the RS decoder according to the present invention is significantly reduced.

Figure 6:
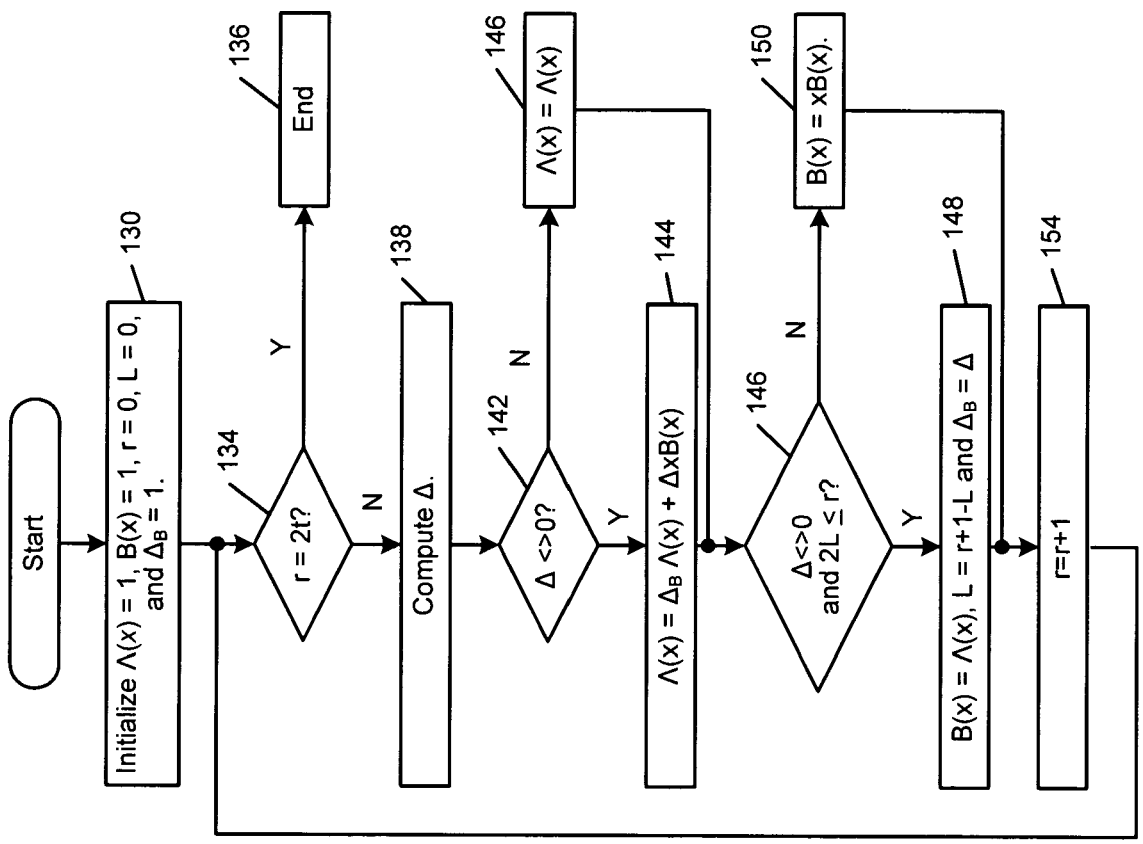
FIG. 6 illustrates steps of an inversionless BMA (iBMA) for calculating an error locator polynomial according to the prior art.
Figure 7:
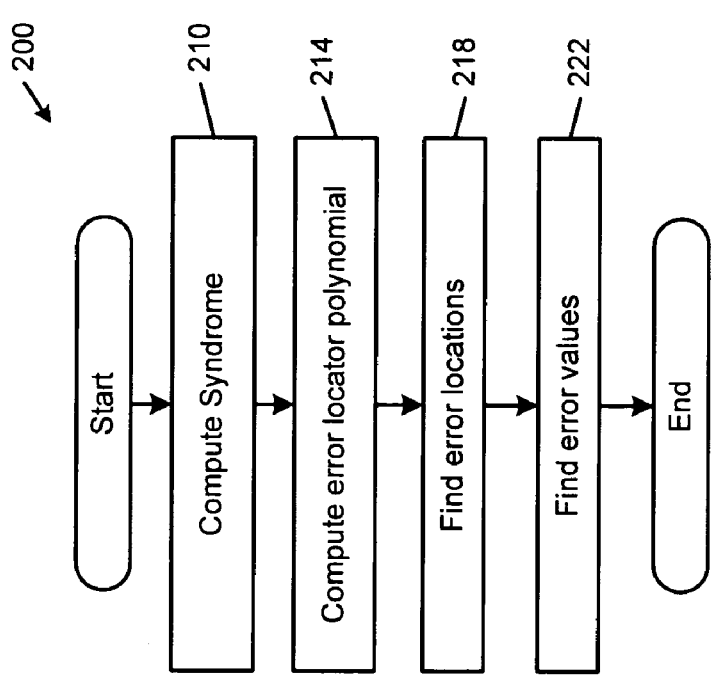
FIG. 7 illustrates steps performed by a RS decoder according to the present invention.

Referring now to FIG. 7, steps that are performed by a RS decoder according to the present invention are shown generally at 200. In step 210, the RS decoder computes syndrome values as previously described above. In step 214, the RS decoder computes an error locator polynomial using an inversionless Berlekamp-Massey algorithm (iBMA), such as the iBMA algorithm shown in FIG. 6.

In step 218, the RS decoder finds error locations. For example, Chien's search algorithm can be used. If the degree of $\Lambda(x)$ is small, the roots of $\Lambda(x)$ can be found directly without doing a search. In step 222, error values are found using an error value relationship according to the present invention that will be described further below.

At the end of the iBMA algorithm, the error values can be calculated by the error values finder 248 using the error value relationship:

$$e_i = \begin{cases} 0 & \text{if } \Lambda(\alpha^{-i}) \neq 0, \\ \dfrac{\Lambda_0 \Delta_B \alpha^{-i(m_0+2t-1)}}{\alpha^{-i} B^{(2t)}(\alpha^{-i}) \Lambda'(\alpha^{-i})} & \text{if } \Lambda(\alpha^{-i}) = 0, \end{cases}$$

or equivalently:

$$Y_l = \frac{\Lambda_0 \Delta_B X_l^{-(m_0+2t-1)}}{X_l B^{(2t)}(X_l^{-1}) \Lambda'(X_l^{-1})},$$

where $\Lambda_0$ is the coefficient of the 0-th degree term of $\Lambda(x)$, $m_0$ and $t$ are integers defining the Reed-Solomon code, $\Delta_B$ is a discrepancy value, $\alpha$ is a primitive element of GF(q), $B^{(2t)}(x)$ is the scratch polynomial at the end of iBMA, and $\Lambda'(x)$ is the formal derivative of the error locator polynomial $\Lambda(x)$.

Figure 8:
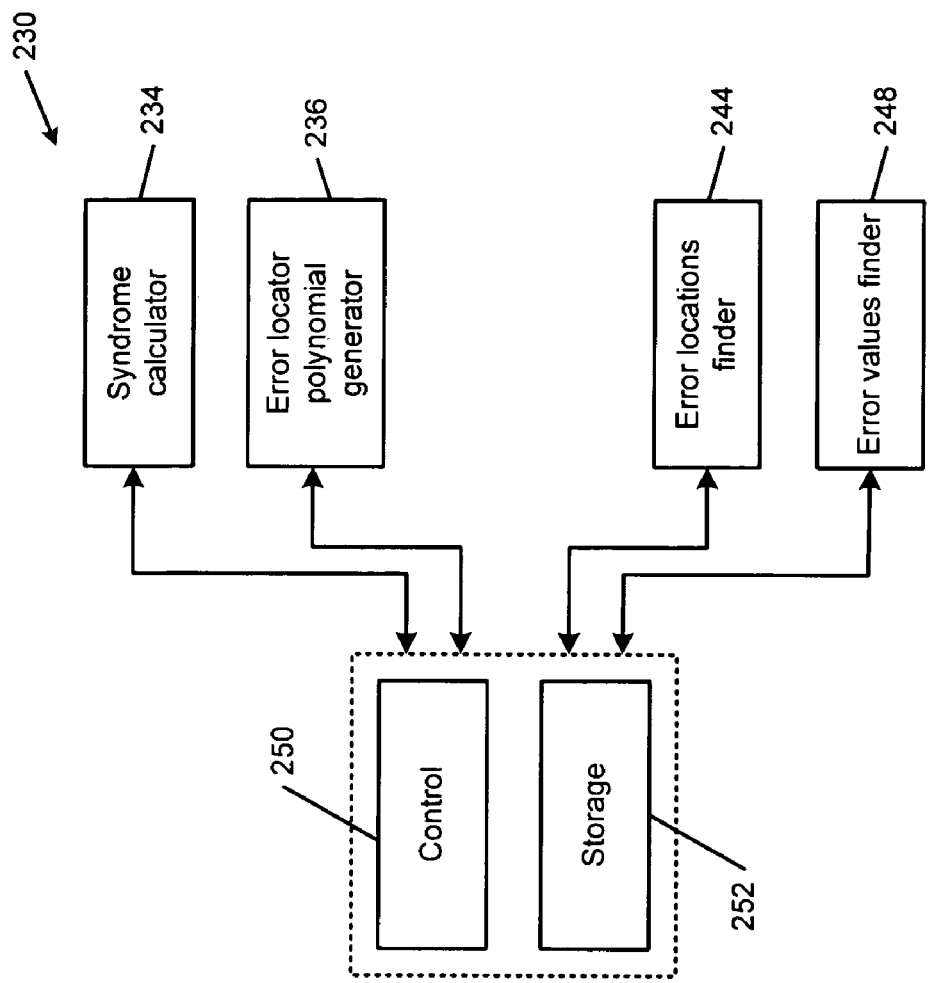
FIG. 8 is a functional block diagram of a RS decoder according to the present invention.

Referring now to FIG. 8, a t-error correcting RS decoder 230 according to the present invention includes a syndrome calculator 234 that generates syndrome values $S_0, S_1, \ldots, S_{2t-1}$. An error locator polynomial generator 236 generates the error locator polynomial using iBMA. An error locations finder 244, such as Chien's search or other error locations finding algorithm, locates error locations.

An error values finder 248 locates errors using the error value relationship according to the present invention. The error values finder 248 is not based on the error evaluator polynomial and therefore does not require the error evaluator polynomial to be calculated. Control 250 coordinates and controls decoding and storage 252 (such as registers, latches, memory or other electronic storage) stores data values for use by the RS decoder 230.

The RS decoder 230 can be a register-based VLSI circuit, software and a processor, an application specific integrated circuit (ASIC), and/or combinations thereof. One suitable register-based implementation of the error value relationship disclosed above and the iBMA is disclosed in "Efficient High-Speed Reed-Solomon Decoder," U.S. patent application Ser. No. 10/305,091, filed Nov. 26, 2002, which is hereby incorporated by reference. As can be appreciated, some of the components of the RS decoder 230 can share multipliers and/or other elements to reduce cost.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An error correcting Reed-Solomon decoder comprising:
   an error locator polynomial generator that generates an error locator polynomial and a scratch polynomial based on an inversionless Berlekamp-Massey algorithm (iBMA);
   an error location finder that communicates with said error locator polynomial generator and that generates error locations; and
   an error values finder that communicates with said error locator polynomial generator and that generates error values directly from said error locator polynomial and said scratch polynomial.

2. The error correcting Reed-Solomon decoder of claim 1 further comprising a syndrome calculator that calculates syndrome values.

3. The error correcting Reed-Solomon decoder of claim 2 wherein said error locator polynomial generator uses said syndrome values to generate said error locator and scratch polymials.

4. The error correcting Reed-Solomon decoder of claim 1 wherein said error location finder determines roots of said error locator polynomial, said roots representing said error locations.

5. The error correcting Reed-Solomon decoder of claim 1 wherein each of said error values corresponds to one of said error locations and said error values finder determines said error values by evaluating an expression for each of said error locations.

6. The error correcting Reed-Solomon decoder of claim 5 wherein said error locator polynomial generator generates a discrepancy value concurrently with said error locator polynomial, and said expression includes said discrepancy value.

7. The error correcting Reed-Solomon decoder of claim 5 wherein said expression includes a derivative of said error locator polynomial.

8. An error correcting Reed-Solomon decoder comprising:
   error locator polynomial generating means for generating an error locator polynomial and a scratch polynomial based on an inversionless Berlekamp-Massey algorithm (iBMA);
   error location finding means that communicates with said error locator polynomial generating means for generating error locations; and
   error values finding means that communicates with said error locator polynomial generating means for generating error values directly from said error locator polynomial and said scratch polynomial.

9. The error correcting Reed-Solomon decoder of claim 8 further comprising syndrome calculating means for calculating syndrome values.

10. The error correcting Reed-Solomon decoder of claim 9 wherein said error locator polynomial generating means uses said syndrome values to generate said error locator and scratch polynomials.

11. The error correcting Reed-Solomon decoder of claim 8 wherein said error location finding means determines roots of said error locator polynomial, said roots representing said error locations.

12. The error correcting Reed-Solomon decoder of claim 8 wherein each of said error values corresponds to one of said error locations and said error values finding means determines said error values by evaluating an expression for each of said error locations.

13. The error correcting Reed-Solomon decoder of claim 12 wherein said error locator polynomial generating means generates a discrepancy value concurrently with said error locator polynomial, and said expression includes said discrepancy value.

14. The error correcting Reed-Solomon decoder of claim 12 wherein said expression includes a derivative of said error locator polynomial.

15. A method for performing error correction comprising:
generating an error locator polynomial and a scratch polynomial based on an inversionless Berlekamp-Massey algorithm (iBMA);
identifying error locations using said error locator polynomial; and
identifying error values directly from said error locator polynomial and said scratch polynomial.

16. The method of claim 15 further comprising calculating syndrome values.

17. The error correcting Reed-Solomon decoder of claim 16 wherein said generating includes using said syndrome values to generate said error locator and scratch polynomials.

18. The error correcting Reed-Solomon decoder of claim 15 wherein said identifying error locations includes determining roots of said error locator polynomial, said roots representing said error locations.

19. The error correcting Reed-Solomon decoder of claim 15 wherein each of said error values corresponds to one of said error locations and said identifying error values includes evaluating an expression for each of said error locations.

20. The error correcting Reed-Solomon decoder of claim 15 wherein said generating includes generating a discrepancy value concurrently with said error locator polynomial, and said expression includes said discrepancy value.

21. The error correcting Reed-Solomon decoder of claim 20 wherein said expression includes a derivative of said error locator polynomial.

22. An error correcting Reed-Solomon decoder, comprising:
a syndrome calculator that calculates syndrome values;
an error locator polynomial generator that communicates with said syndrome calculator and that generates an error locator polynomial;
an error location finder that communicates with at least one of said syndrome calculator and said error locator polynomial generator and that generates error locations; and
an error values finder that communicates with at least one of said syndrome calculator, said error location finder and said error locator polynomial generator and that generates error values without calculating an error evaluator polynomial,
wherein said the error values are calculated using an error value relationship set forth below:

$$Y_l = \frac{\Lambda_0 \Delta_B X_l^{-(m_0+2t-1)}}{X_l B^{(2t)}(X_l^{-1})\Lambda'(X_l^{-1})}.$$

wherein $\Lambda_0$ is a coefficient of a 0-th degree term of an error locator polynomial $\Lambda(x)$, $m_0$ and t are integers defining Reed-Solomon code, $\Delta_B$ is a discrepancy value, $\alpha$ is a primitive element of GF(q), $B^{(2t)}(x)$ is a scratch polynomial, and $\Lambda'(x)$ is a derivative of said error locator polynomial $\Lambda(x)$.

23. The error correcting Reed-Solomon decoder of claim 22 wherein said error locator polynomial generator is an inversionless Berlekamp-Massey algorithm (iBMA).

24. The error correcting Reed-Solomon decoder of claim 23 wherein said iBMA generates an error locator polynomial and a scratch polynomial and wherein said error values finder calculates said error values using an error value relationship that is based on said error locator polynomial and said scratch polynomial.

25. The error correcting Reed-Solomon decoder of claim 22 wherein said error location finder finds zeros in said error locator polynomial.

26. An error correcting Reed-Solomon decoder, comprising:
syndrome calculating means for calculating syndrome values;
error locator polynomial generating means that communicates with said syndrome calculating means for generating an error locator polynomial;
error location finding means that communicates with at least one of said syndrome calculating means and said error locator polynomial generating means for generating error locations; and
error values finding means that communicates with at least one of said syndrome calculating means, said error location finding means and said error locator polynomial generating means for generating error values without calculating an error evaluator polynomial,
wherein said the error values are calculated using an error value relationship set forth below:

$$Y_l = \frac{\Lambda_0 \Delta_B X_l^{-(m_0+2t-1)}}{X_l B^{(2t)}(X_l^{-1})\Lambda'(X_l^{-1})}.$$

wherein $\Lambda_0$ is a coefficient of a 0-th degree term of an error locator polynomial $\Lambda(x)$, $m_0$ and t are integers defining Reed-Solomon code, $\Delta_B$ is a discrepancy value, $\alpha$ is a primitive element of GF(q), $B^{(2t)}(x)$ is a scratch polynomial, and $\Lambda'(x)$ is a derivative of the error locator polynomial $\Lambda(x)$.

27. The error correcting Reed-Solomon decoder of claim 26 wherein said error locator polynomial generating means implements an inversionless Berlekamp-Massey algorithm (iBMA).

28. The error correcting Reed-Solomon decoder of claim 27 wherein said iBMA generates an error locator polynomial and a scratch polynomial and wherein said error values finding means calculates said error values using an error value relationship that is based on said error locator polynomial and said scratch polynomial.

29. The error correcting Reed-Solomon decoder of claim 26 wherein said error location finding means finds zeros in said error locator polynomial.

30. A method for performing error correction in a Reed-Solomon decoder, comprising:
   calculating syndrome values;
   generating an error locator polynomial based on said syndrome values;
   identifying error locations using said error locator polynomial; and
   identifying error values without calculating an error evaluator polynomial; and
   calculating said the error values using an error value relationship set forth below:

$$Y_l = \frac{\Lambda_0 \Delta_B X_l^{-(m_0+2t-1)}}{X_l B^{(2t)}(X_l^{-1}) \Lambda'(X_l^{-1})}.$$

wherein $\Lambda_0$ is a coefficient of a 0-th degree term of an error locator polynomial $\Lambda(x)$, $m_0$ and $t$ are integers defining Reed-Solomon code, $\Delta_B$ is a discrepancy value, $\alpha$ is a primitive element of GF(q), $B^{(2t)}(x)$ is a scratch polynomial, and $\Lambda'(x)$ is a derivative of the error locator polynomial $\Lambda(x)$.

31. The method of claim 30 wherein said error locator polynomial is generated using an inversionless Berlekamp-Massey algorithm (iBMA).

32. The method of claim 31 wherein said step of generating said error locator polynomial includes:
   generating an error locator polynomial; and
   generating a scratch polynomial, and wherein said error values are identified using an error value relationship that is based on said error locator polynomial and said scratch polynomial.

33. The method of claim 30 wherein said step of identifying error locations includes finding zeros in said error locator polynomial.

* * * * *

UNITED STATES PATENT AND TRADEMARK OFFICE
CERTIFICATE OF CORRECTION

PATENT NO. : 7,249,310 B1
APPLICATION NO. : 11/243283
DATED : July 24, 2007
INVENTOR(S) : Weishi Feng et al.

It is certified that error appears in the above-identified patent and that said Letters Patent is hereby corrected as shown below:

Column 3, Line 2  Delete "$C_{m_0} = \ldots = C_{m_0+2l-} = 0$" and insert

-- $C_{m_0} = \ldots = C_{m_0+2l-1} = 0$ --

Column 4, Line 21  Delete "$\Lambda_r$" and insert -- $\Delta_r$ --
Column 4, Line 28  Delete "$\Lambda(x)=$" (not shown on this page as listed on patent)
Column 5, Line 1  Delete "a←r←2L" and insert -- a←r—2L --
Column 6, Line 41  Delete "←(x)" and insert -- $\Lambda(x)$ --
Column 6, Line 42  Delete "←(0)" and insert -- $\Lambda(0)$ --

Signed and Sealed this

Thirteenth Day of May, 2008

JON W. DUDAS
*Director of the United States Patent and Trademark Office*